US010833200B2

(12) United States Patent
Lee et al.

(10) Patent No.: US 10,833,200 B2
(45) Date of Patent: Nov. 10, 2020

(54) TECHNIQUES FOR FORMING VERTICAL TRANSPORT FET HAVING GATE STACKS WITH A COMBINATION OF WORK FUNCTION METALS

(71) Applicant: International Business Machines Corporation, Armonk, NY (US)

(72) Inventors: Choonghyun Lee, Rensselaer, NY (US); Kangguo Cheng, Schenectady, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/738,756

(22) Filed: Jan. 9, 2020

(65) Prior Publication Data

US 2020/0152524 A1    May 14, 2020

Related U.S. Application Data

(62) Division of application No. 16/037,993, filed on Jul. 17, 2018, now Pat. No. 10,566,251.

(51) Int. Cl.
*H01L 29/786* (2006.01)
*H01L 29/66* (2006.01)
(Continued)

(52) U.S. Cl.
CPC .. *H01L 29/78642* (2013.01); *H01L 21/31053* (2013.01); *H01L 21/31111* (2013.01); *H01L 21/32134* (2013.01); *H01L 21/32139* (2013.01); *H01L 21/823431* (2013.01); *H01L 21/823821* (2013.01); *H01L 21/845* (2013.01);
(Continued)

(58) Field of Classification Search
CPC .............. H01L 29/4966; H01L 29/517; H01L 29/6656; H01L 29/66666; H01L 29/78642
See application file for complete search history.

(56) References Cited

U.S. PATENT DOCUMENTS 9,142,660 B2    9/2015  Guo et al.
9,299,835 B1    3/2016  Anderson et al.
(Continued)

OTHER PUBLICATIONS

List of IBM Patents or Applications Treated as Related (2 pages).

*Primary Examiner* — Michael Jung
(74) *Attorney, Agent, or Firm* — Douglas Pearson; Michael J. Chang, LLC

(57) ABSTRACT

Techniques for reducing work function metal variability along the channel of VFET devices are provided. In one aspect, a method of forming a VTFET device includes: patterning fins in a wafer; forming bottom source/drains at a base of the fins and bottom spacers on the bottom source/drains; forming gate stacks over the fins including a gate conductor having a combination of work function metals including an outer layer and at least one inner layer of the work function metals; isotropically etching the work function metals which recesses the gate stacks with an outwardly downward sloping profile; isotropically etching the at least one inner layer while covering the outer layer of the work function metals to eliminate the outwardly downward sloping profile of the gate stacks; forming top spacers above the gate stacks; and forming top source and drains at tops of the fins. A VTFET device is also provided.

20 Claims, 7 Drawing Sheets

(51) Int. Cl.
*H01L 21/84* (2006.01)
*H01L 29/49* (2006.01)
*H01L 21/3213* (2006.01)
*H01L 29/51* (2006.01)
*H01L 21/3105* (2006.01)
*H01L 21/311* (2006.01)
*H01L 21/8238* (2006.01)
*H01L 21/8234* (2006.01)

(52) U.S. Cl.
CPC ........ *H01L 29/4966* (2013.01); *H01L 29/517* (2013.01); *H01L 29/6656* (2013.01); *H01L 29/66666* (2013.01)

(56) References Cited

U.S. PATENT DOCUMENTS

| | | | |
|---|---|---|---|
| 9,502,265 B1 * | 11/2016 | Jiang | H01L 21/31155 |
| 9,530,866 B1 * | 12/2016 | Zhang | H01L 29/0676 |
| 9,911,748 B2 | 3/2018 | Nishikawa et al. | |
| 2006/0084283 A1 | 4/2006 | Paranjpe et al. | |
| 2014/0264490 A1 * | 9/2014 | Ponoth | H01L 29/66545 |
| | | | 257/288 |
| 2014/0353593 A1 | 12/2014 | Smets | |
| 2015/0255604 A1 | 9/2015 | Yang | |
| 2015/0318213 A1 * | 11/2015 | Tsai | H01L 29/42376 |
| | | | 257/9 |
| 2015/0372149 A1 | 12/2015 | Colinge et al. | |
| 2015/0380548 A1 * | 12/2015 | Wang | H01L 29/7889 |
| | | | 257/329 |
| 2016/0293756 A1 | 10/2016 | Liu et al. | |
| 2017/0194155 A1 | 7/2017 | Anderson et al. | |
| 2018/0061829 A1 | 3/2018 | Cheng et al. | |
| 2018/0090581 A1 | 3/2018 | Balakrishnan et al. | |

* cited by examiner

TECHNIQUES FOR FORMING VERTICAL TRANSPORT FET HAVING GATE STACKS WITH A COMBINATION OF WORK FUNCTION METALS

CROSS-REFERENCE TO RELATED APPLICATIONS

This application is a divisional of U.S. application Ser. No. 16/037,993 filed on Jul. 17, 2018, now U.S. Pat. No. 10,566,251, the contents of which are incorporated by reference herein.

FIELD OF THE INVENTION

The present invention relates to vertical transport field-effect transistor (VTFET) devices, and more particularly, to techniques for reducing work function metal variability along channels of VFET devices.

BACKGROUND OF THE INVENTION

As opposed to planar complementary metal-oxide-semiconductor (CMOS) devices, vertical transport field effect transistor (VTFET) devices are oriented with a vertical fin channel disposed on a bottom source/drain and a top source/drain disposed on the fin channel. VTFETs are being pursued as a viable CMOS architecture beyond the 7 nanometer (nm) node and beyond.

Combinations of work function metals can be used to achieve various threshold voltages (Vt) in CMOS devices. In a VTFET integration process flow, gate dielectric and work function metals are recessed to a certain level to define the channel length. However, due to the isotropic wet etch characteristics, the outer work function metal is inevitably over-etched (based on a longer exposure time to the wet chemistry), resulting in non-uniform work function metal thickness along the channel. This non-uniformity undesirably causes severe Vt variation from the top to the bottom of the channel.

Therefore, VTFET fabrication techniques that address this problem to improve the uniformity of work function metal thickness along the channel would be desirable.

SUMMARY OF THE INVENTION

The present invention provides techniques for reducing work function metal variability along the channel of vertical transport field effect transistor (VTFET) devices. In one aspect of the invention, a method of forming a VTFET device is provided. The method includes: patterning fins in a wafer; forming bottom source and drains at a base of the fins; forming bottom spacers on the bottom source and drains; forming gate stacks over the fins, the gate stacks including a gate conductor having a combination of work function metals including an outer layer and at least one inner layer of the work function metals; isotropically etching the outer layer and the at least one inner layer of the work function metals which, due to the combination of the work function metals, recesses the gate stacks with an outwardly downward sloping profile; isotropically etching the at least one inner layer of the work function metals while covering the outer layer of the work function metals to eliminate the outwardly downward sloping profile of the gate stacks; forming top spacers above the gate stacks; and forming top source and drains at tops of the fins over the top spacers.

In another aspect of the invention, a VTFET device is provided. The VTFET device includes: fins patterned in a wafer; bottom source and drains formed at a base of the fins; bottom spacers disposed on the bottom source and drains; gate stacks alongside the fins, the gate stacks including a gate conductor having a combination of work function metals including an outer layer and at least one inner layer of the work function metals, wherein the gate stacks have a uniform thickness from a bottom to a top of the fins; top spacers disposed above the gate stacks; and top source and drains at tops of the fins over the top spacers.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for fabricating vertical transport field effect transistor (VTFET) devices with a uniform threshold voltage (Vt) distribution along the channel, which can reduce the variation of device performance. The present techniques can also be applied to define an accurate gate length (Lg) in VTFET devices, which have different work function metals for multi-Vt designs.

Figure 1:
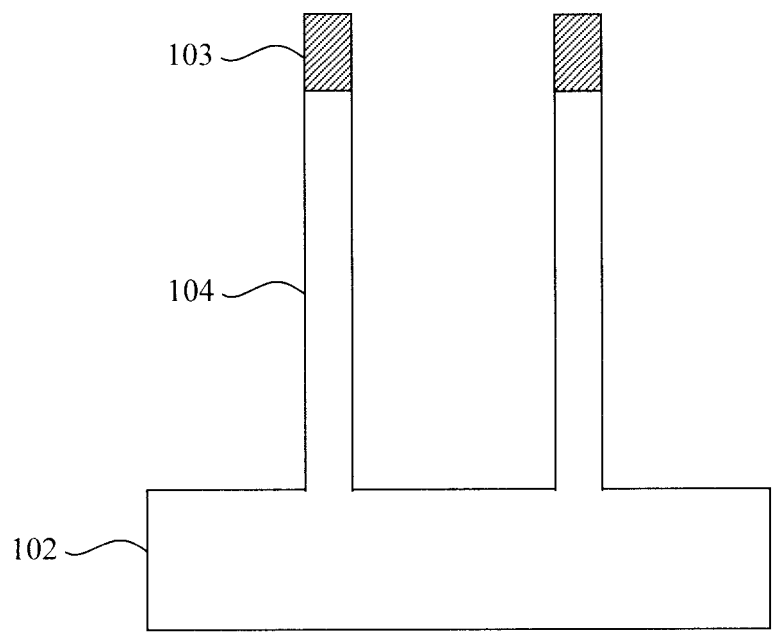
FIG. 1 is a cross-sectional diagram illustrating fin hardmasks having been used to pattern a plurality of fins in a wafer according to an embodiment of the present invention.

An exemplary methodology for forming a VTFET device in accordance with the present techniques is now described by way of reference to FIGS. 1-13. As shown in FIG. 1, the process begins with a wafer 102. According to an exemplary embodiment, wafer 102 is a bulk semiconductor wafer, such as a bulk silicon (Si), bulk germanium (Ge), bulk silicon germanium (SiGe) and/or bulk III-V semiconductor wafer. Alternatively, wafer 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

A plurality of fins 104 are then patterned in the wafer 102. To do so, a plurality of patterned fin hardmasks 103 are formed on the wafer marking the footprint and location of the fins 104. The fin hardmasks 103 can be formed by first depositing a suitable hardmask material on the wafer 102 and then using standard lithography and etching techniques to pattern the hardmask material into the individual fin hardmasks 103 shown in FIG. 1. Suitable hardmask materials include, but are not limited to, nitride hardmask materials such as silicon nitride (SiN).

The fin hardmasks 103 are then used to pattern the fins 104 in the wafer 102. A directional (anisotropic) etching process such as reactive ion etching (RIE) can be used for the fin etch. As shown in FIG. 1, as patterned, the fins 104 extend partway through the wafer 102.

A mask layer (not shown), formed for example from SiN, is deposited using, for example, atomic layer deposition (ALD) or other conformal deposition process. Horizontal portions of the deposited mask layer are removed using a directional (e.g., anisotropic) removal process such as reactive ion etching (RIE) to result in the mask layer being formed on fin sidewalls. Bottom source and drains 202 are then formed in the wafer 102 at the base of the fins 104. See FIG. 2. Before bottom source and drain formation, recessing of the wafer 102 is performed using, for example, directional RIE containing fluorine or chlorine-based gases or wet etch containing a hydrofluoric acid etchant. Then, bottom source/drain regions 202 are epitaxially grown in a bottom-up epitaxial growth process from the recessed portions of the wafer 102 in trenches formed by the recessing. The epitaxially grown bottom source/drain regions 202 can be doped using processes such as ion implantation, in situ, gas phase doping, plasma doping, plasma immersion ion implantation, cluster doping, infusion doping, liquid phase doping, solid phase doping, etc., and dopants may include, for example, an n-type dopant selected from a group including phosphorus (P), arsenic (As) and/or antimony (Sb), and a p-type dopant selected from a group including boron (B), gallium (Ga), indium (In) and/or thallium (Tl) at various concentrations. For example, in a non-limiting example, a dopant concentration may be from about $1 \times 10^{18}$ cm$^3$ to about $1 \times 10^{21}$ cm$^3$ and ranges therebetween. For instance, according to an exemplary embodiment, the bottom source and drains 202 are formed by growing a doped epitaxial material (such as phosphorous-doped epitaxial Si (Si:P) or boron-doped epitaxial SiGe (SiGe:B)) on the wafer 102 in between the fins 104. By way of example only, the bottom source and drains 202 are formed having a thickness of from about 20 nm to about 60 nm and ranges therebetween.

Bottom spacers 204 are then formed on the bottom source and drains 202. Suitable materials for the bottom spacers 204 include, but are not limited to, oxide spacer materials such as SiO$_2$ and/or silicon oxycarbide (SiOC) and/or nitride spacer materials such as SiN, silicon-boron-nitride (SiBN), siliconborocarbonitride (SiBCN) and/or silicon oxycarbonitride (SiOCN).

According to an exemplary embodiment, the bottom spacers 204 are formed using a directional deposition process whereby the spacer material is deposited onto the bottom source and drains 202 and fins 104 with a greater amount of the material being deposited on horizontal surfaces (including on top of the bottom source and drains 202 in between the fins 104), as compared to vertical surfaces (such as along sidewalls of the fins 104). Thus, when an etch is used on the spacer material, the timing of the etch needed to remove the spacer material from the vertical surfaces will leave the bottom spacers 204 shown in FIG. 2 on the bottom source and drains 202 since a greater amount of the spacer material was deposited on the bottom source and drains 202. By way of example only, a high-density plasma (HDP) chemical vapor deposition (CVD) or physical vapor deposition (PVD) process can be used for directional film deposition, and an oxide- or nitride-selective (depending on the spacer material) isotropic etch can be used to remove the (thinner) spacer material deposited onto the vertical surfaces. The bottom spacers can be formed having a thickness of from about 5 nm to about 20 nm and ranges therebetween.

Gate stacks are then formed alongside the fins 104. In the present example, the gate stacks are metal gates where the gate conductor is a combination of two or more work function metals. Namely, the present techniques will be leveraged to prevent greater etching of the outer work function metal(s) (relative to the inner work function metal(s)) during the gate recess etch (see below) that, as with conventional processes, undesirably leads to Vt and Lg variation along the channel.

As shown in magnified view 220, the gate stacks include an interfacial oxide 206 on exposed surfaces of the fins 104, a conformal gate dielectric 208 deposited onto the fins 104 over the interfacial oxide 206, and a conformal gate conductor 210 deposited onto the gate dielectric 208. According to an exemplary embodiment, the gate conductor 210 is composed of a combination of work function metals including an outer layer 212 and at least one inner layer of the work function metals. In this particular example, there are two inner layers of work function metals, i.e., a (first) inner layer 214 adjacent to the outer layer 212 and (second) inner layer 216 adjacent to the inner layer 214. The term "outer," as used herein, refers to the layer of work function metal in the gate conductor farthest out from the underlying fin 104, while the term "inner" refers to the layer(s) of work function metal in between the outer layer and the fin 104.

According to an exemplary embodiment, the interfacial oxide 206 is formed selectively on the exposed surfaces of the fins 104 by an oxidation process to a thickness of from about 0.3 nanometers (nm) to about 5 nm, and ranges therebetween, e.g., about 1 nm. The gate dielectric 208 can be deposited by any suitable process or combination of processes, including but not limited to, thermal oxidation, chemical oxidation, thermal nitridation, plasma oxidation, plasma nitridation, atomic layer deposition (ALD), chemical vapor deposition (CVD), etc. According to an exemplary embodiment, the gate dielectric has a thickness of from about 1 nm to about 5 nm and ranges therebetween.

Suitable gate dielectrics include, but are not limited to, silicon oxide (SiOx), silicon nitride (SiN), silicon oxynitride (SiOxNy), high-κ materials, or any combination thereof. The term "high-κ" as used herein refers to a material having a relative dielectric constant κ which is much higher than that of silicon dioxide (e.g., a dielectric constant κ is about 25 for hafnium oxide ($HfO_2$) rather than 3.9 for $SiO_2$). Suitable high-κ gate dielectric materials include, but are not limited to, metal oxides such as hafnium oxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium oxide ($ZrO_2$), zirconium silicon oxide ($ZrSiO_4$), zirconium silicon oxynitride (ZrSiOxNy), tantalum oxide (TaOx), titanium oxide (TiO), barium strontium titanium oxide ($BaO_6SrTi_2$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$) and/or lead zinc niobite (Pb(Zn,Nb)O). The high-κ can further include dopants such as lanthanum (La), aluminum (Al) and/or magnesium (Mg).

The layers of work function metals can be deposited by any suitable process or combination of processes, including but not limited to, ALD, CVD, physical vapor deposition (PVD), sputtering, plating, evaporation, ion beam deposition, electron beam deposition, laser assisted deposition, chemical solution deposition, etc. Suitable work function metals include, but are not limited to, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), titanium carbide (TiC) titanium aluminum carbide (TiAlC), tantalum carbide (TaC) and/or hafnium carbide (HfC).

In the present example, the outer and first/second inner layers 212 and 214/216 each includes at least one of the work function metals provided above. To use an illustrative non-limiting example, one possible configuration of the outer layer 212/first inner layer 214/second inner layer 216 is TiN/TiAlC/TiN. It is however not required that any two of the layers have the same composition, and configurations are contemplated herein where the first/second inner layers 212 and 214/216 are composed of different work function metals.

Figure 2:
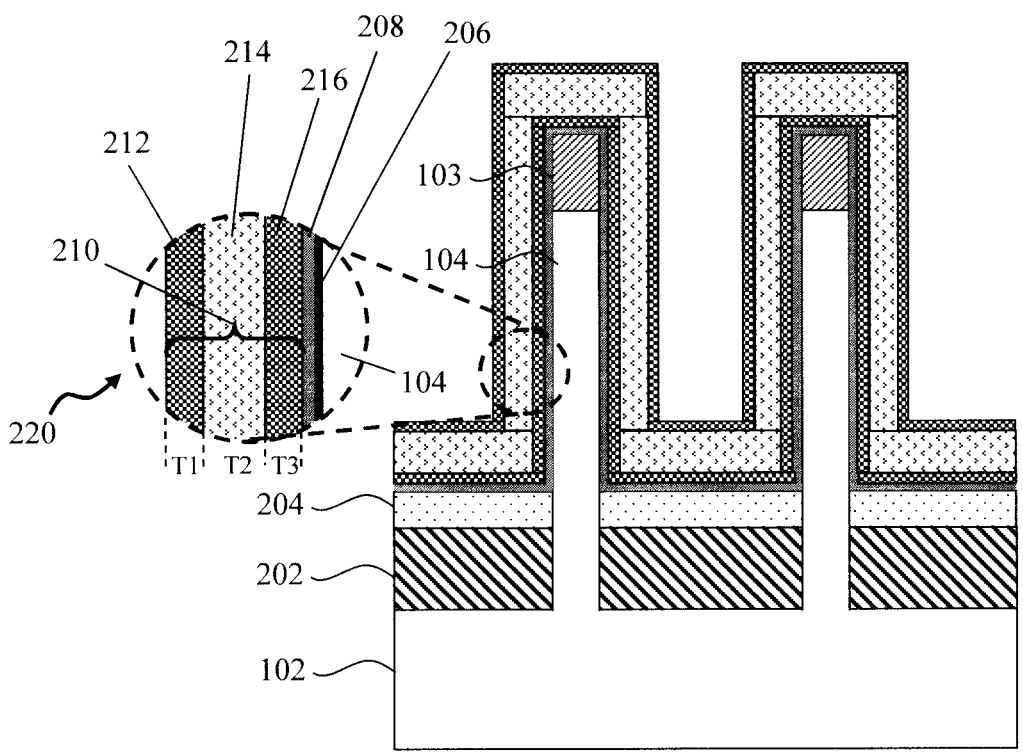
FIG. 2 is a cross-sectional diagram illustrating bottom spacers having been formed on the bottom source and drains, and gate stacks having been formed alongside the fins, the gate stacks including a gate conductor having a combination of work function metals including an outer layer and at least one inner layer of the work function metals according to an embodiment of the present invention.

Further, more or fewer layers of the work function metals can be employed than in the instant example. For example, embodiments are contemplated herein where the gate conductor 210 includes the outer layer 212 and only a single inner layer. Referring to FIG. 2, for instance, eliminating layer 216 of the work function metals from the design would result in layer 214 being the sole inner layer adjacent to the outer layer 212.

The layers of the work function metal can have varied thicknesses. For instance, the outer layer 212, first inner layer 214 and second inner layer 216 can have thicknesses T1, T2 and T3, respectively, wherein T2 is greater than either T1 or T3. Further, while T1 and T3 of the outer and (second) inner layers 212 and 216 can be equal, embodiments are also contemplated herein where the outer layer 212 is slightly thicker than the inner layer 216, i.e., T1>T3. According to an exemplary embodiment, T1 is from about 13 angstroms (Å) to about 17 Å and ranges therebetween, T2 is from about 33 Å to about 37 Å and ranges therebetween, and T3 is from about 8 Å to about 12 Å and ranges therebetween, with a total thickness of the outer and first/second inner layers 212 and 214/216 of from about 4 nanometers (nm) to about 8 nm and ranges therebetween.

Further, it is notable that the positioning (outer or inner), composition and respective etch rate of a layer of the work function metal, as well as its thickness, affect how the recess etch of the gate stack (see below) progresses over time. For instance, using the above example of TiN/TiAlC/TiN, all else being equal the wet etch rate of TiAlC is about 3 times faster than that of TiN. However, when TiAlC is the thicker inner layer to a thinner TiN outer layer, over time a wet etch will remove a relatively greater amount of the TiN outer layer (i.e., the outer layer sees the etchant first and is thinner in this case) creating an outwardly sloping profile for the recessed gate stack. If allowed to progress in that manner, such a recess etch will increase the sloping of the gate stack alongside the fins resulting in a significant amount of Lg variation from the top to the bottom of the fins.

Figure 3:
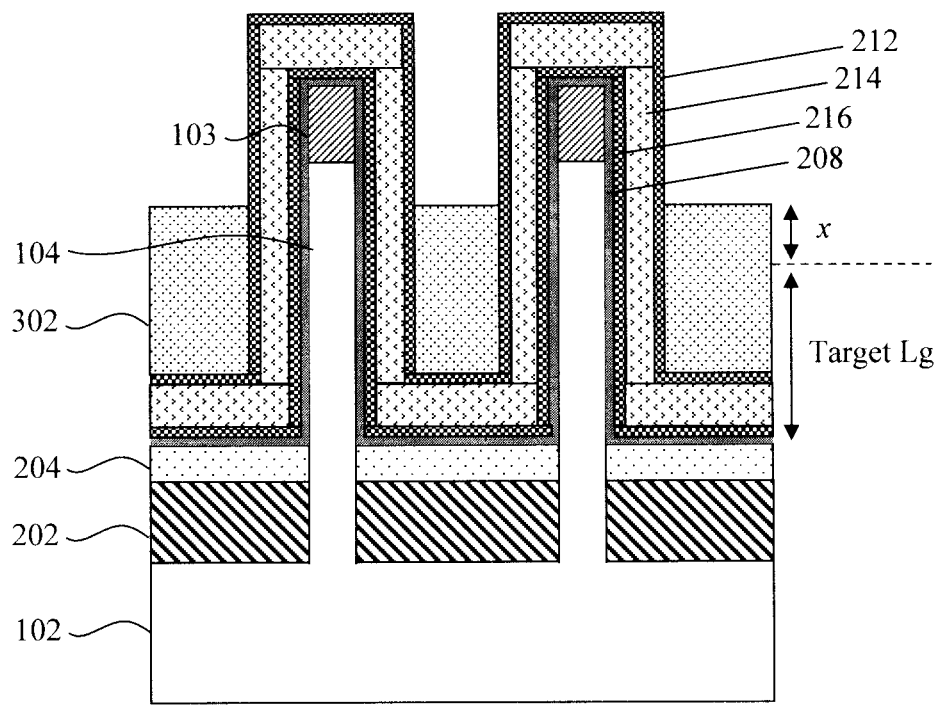
FIG. 3 is a cross-sectional diagram illustrating the fins and gate stacks having been buried in a planarizing dielectric material that is then recessed according to an embodiment of the present invention.

The gate stacks are next recessed which will establish the gate length (Lg) of the VTFET device alongside the fins 104. To do so, the fins 104 and gate stacks are first buried in a planarizing dielectric material 302 such as an organic planarizing layer (OPL) material. See FIG. 3. As shown in FIG. 3, the planarizing dielectric material is then recessed. The recessed planarizing dielectric material 302 sets the Lg of the device. However, in order to accommodate the above-described recess etch variation and permit its correction, the planarizing dielectric material 302 is recessed to a height that is greater than the target gate length (Lg). For instance, as shown in FIG. 3, the recessed planarizing dielectric material 302 is higher than the target Lg by an amount x. For instance, by way of example only, the target Lg is from about 18 nm to about 20 nm and ranges therebetween, and x is from about 4 nm to about 8 nm and ranges therebetween.

Figure 4:
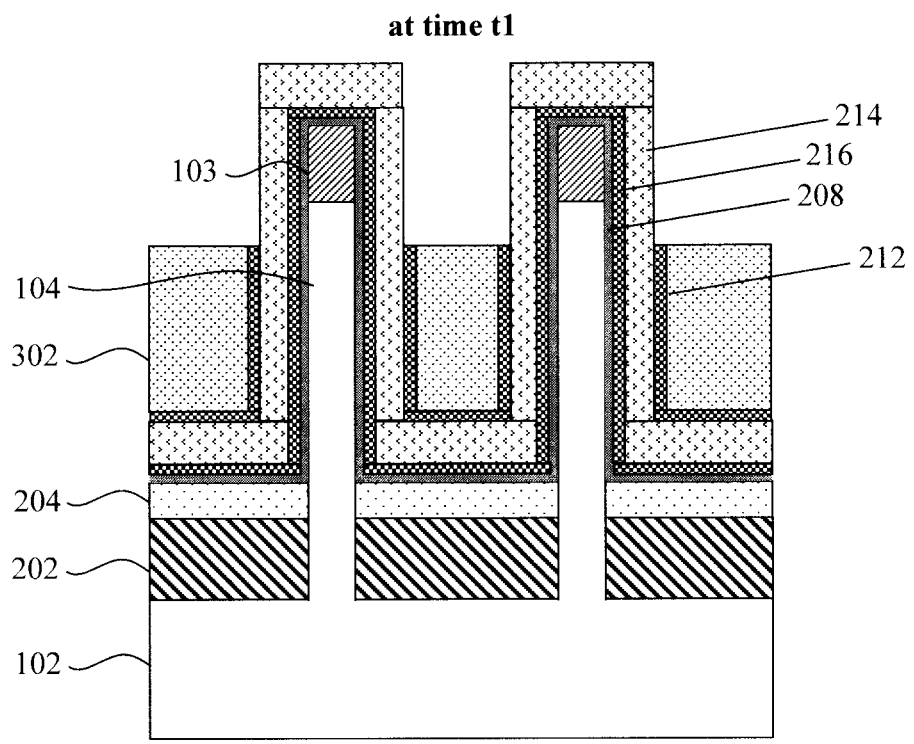
FIG. 4 is a cross-sectional diagram illustrating recessing of the gate stacks at a time t1 where a wet etch removes the exposed outer layer of the work function metal above the recessed planarizing dielectric material according to an embodiment of the present invention.
Figure 5:
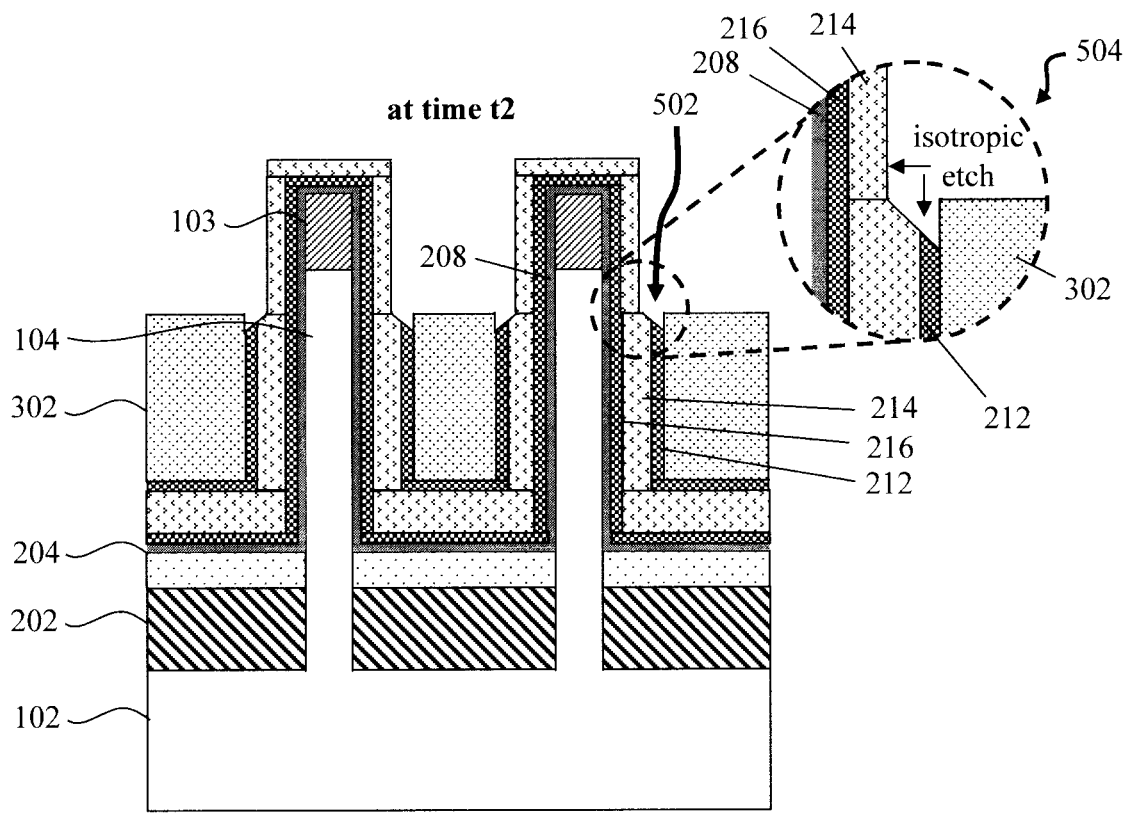
FIG. 5 is a cross-sectional diagram illustrating recessing of the gate stacks at a time t2 where cavities are formed at the outer layer abutting the recessed planarizing dielectric material according to an embodiment of the present invention.
Figure 6:
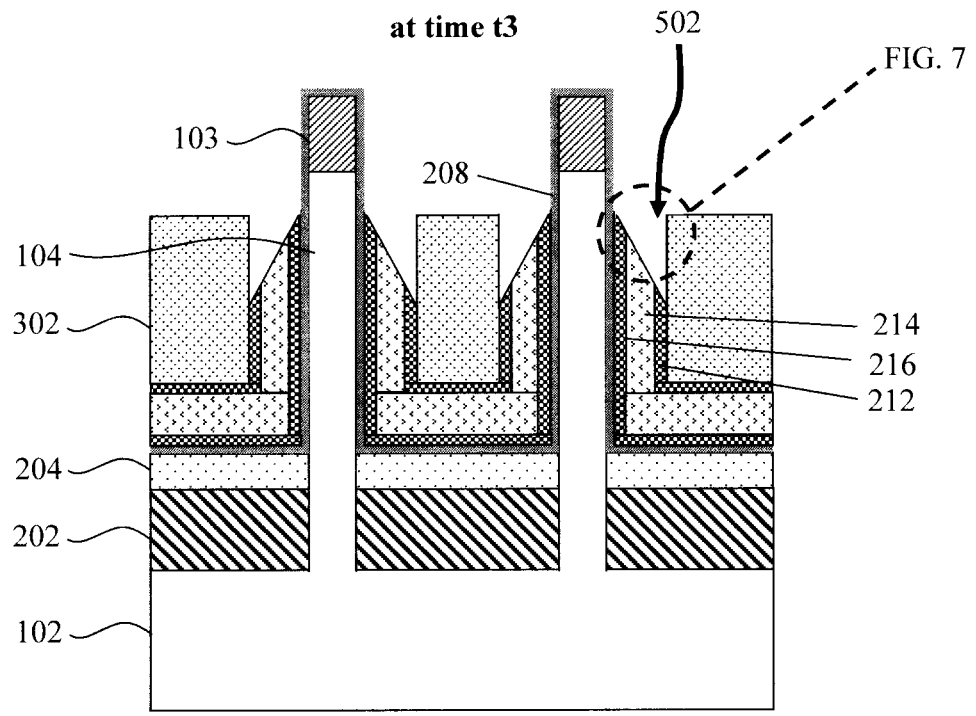
FIG. 6 is a cross-sectional diagram illustrating recessing of the gate stacks at a time t3 where further deepening of the cavities creates an outwardly downward sloping profile for the recessed gate stack according to an embodiment of the present invention.

The gate stacks above the recessed planarizing dielectric material 302 are then recessed. See FIGS. 4-6 which illustrate recessing of the gate stacks at a first time t1, at a later time t2, and at a time t3 at the end of the recess process respectively, i.e., t1<t2<t3. It is to be understood that the wet etch is a progressive process and that the illustrations in FIGS. 4-6 are representative of the gate stack recess at various points in time throughout the process. The recess etch of the gate stacks is performed using a non-directional (i.e., isotropic) etching process such as a wet chemical etch like SC1 ($NH_4OH:H_2O_2:H_2O$). As shown in FIG. 4, at time t1 the wet etch removes the exposed outer layer 212 of the work function metal above the recessed planarizing dielectric material 302. However, since the outer layer 212 of work function metal is exposed to the wet etch chemistry longer than the inner layers, as the etch progresses into the inner layer 214 of work function metal cavities 502 are formed at the outer layer 212 abutting the recessed planarizing dielectric material 302. See FIG. 5 at time t2.

A magnified view 504 is provided of one of the cavities 502. As shown in magnified view 504, the wet etch is isotropic and thus occurs in all directions. Thus, while etching the inner layer 214 of the work function metal, the wet etch also further recesses the outer layer 212 below the recessed planarizing dielectric material 302, resulting in formation of the cavities 502. A wet etch such as SC1 is selective for the work function metals and thus does not remove the planarizing dielectric material 302, thus giving the cavities 502 a distinctive triangular shape.

By the end of the gate stack recess process (i.e., time t3), fully removing the inner layers 214/216 of the work function metal above the recessed planarizing dielectric material 302 results in a further deepening of the cavities 502 thus creating an outwardly downward sloping profile for the recessed gate stack. See FIG. 6. This sloped profile of the recessed gate stack results in an asymmetrical thickness of the work function metals along the vertical channel. If left uncorrected, this asymmetry undesirably leads to significant levels of variability as the threshold voltage (Vt) will shift depending on the thickness of the work function metals at different heights along the vertical channel. See, for example, FIG. 7 which provides a magnified view of one of the cavities 502 at time t3.

Figure 7:
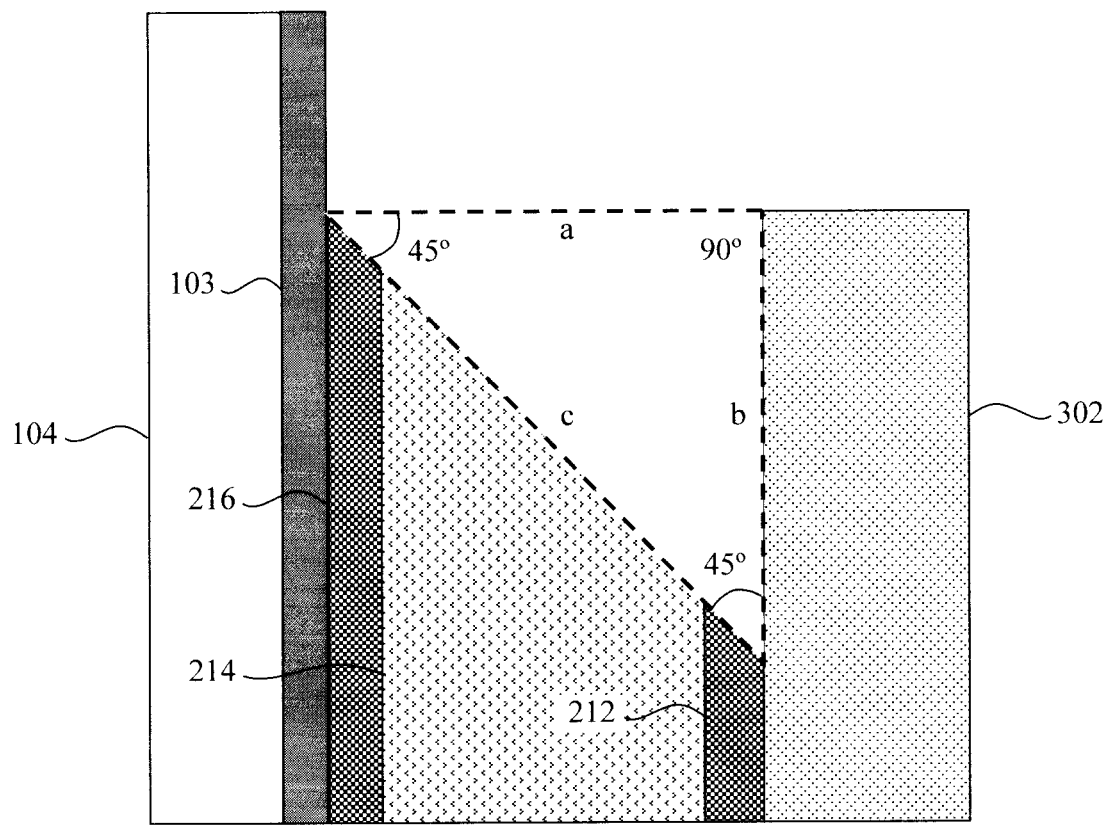
FIG. 7 is a cross-sectional diagram illustrating a magnified view of one of the cavities at time t3 according to an embodiment of the present invention.

In the non-limiting example depicted in FIG. 7, the cavity 502 is generalized as a right triangle having legs a and b forming a 90 degree (°) right angle, and a hypotenuse c opposite the right angle. Assuming for illustrative purposes only that a=b=about 6 nm, and c=about 8.5 nm, and the physical channel length is 20 nm, then about 30% of the channel would have a non-uniform threshold voltage (Vt) distribution along the vertical channel. Advantageously, the present techniques provide an effective mechanism to adjust the thickness of the work function metals via a selective masking of the outer layer 212 of the work function metal and a second wet etch.

Figure 8:
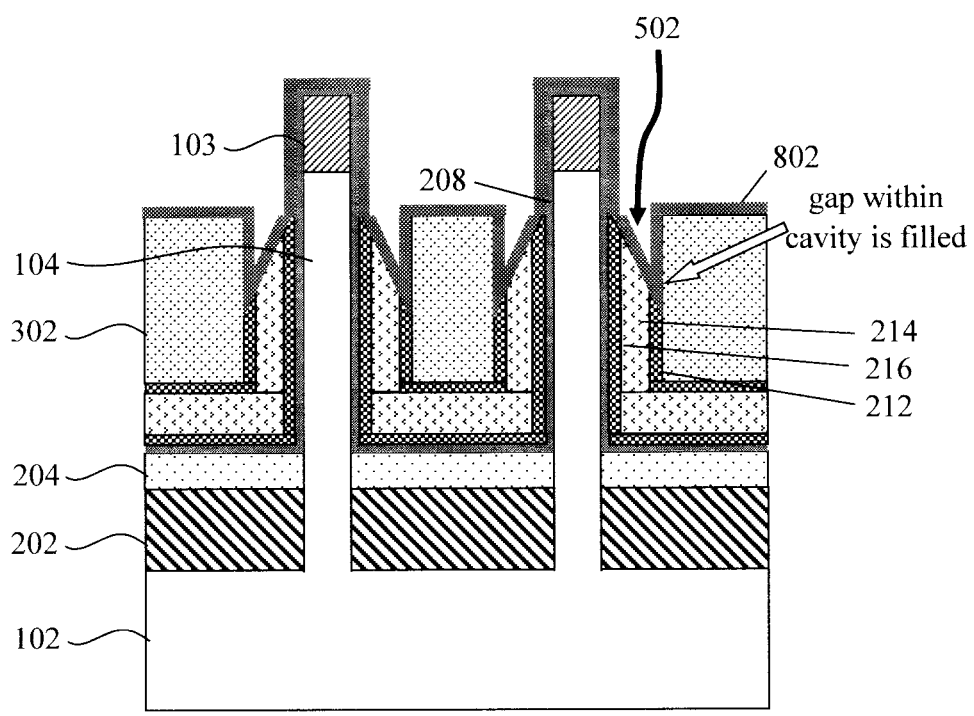
FIG. 8 is a cross-sectional diagram illustrating a conformal liner having been deposited onto the fins and the planarizing dielectric material and lining the cavities, wherein the liner fills gaps within the cavities between the outer layer of the work function metal and the recessed planarizing dielectric material according to an embodiment of the present invention.
Figure 9:
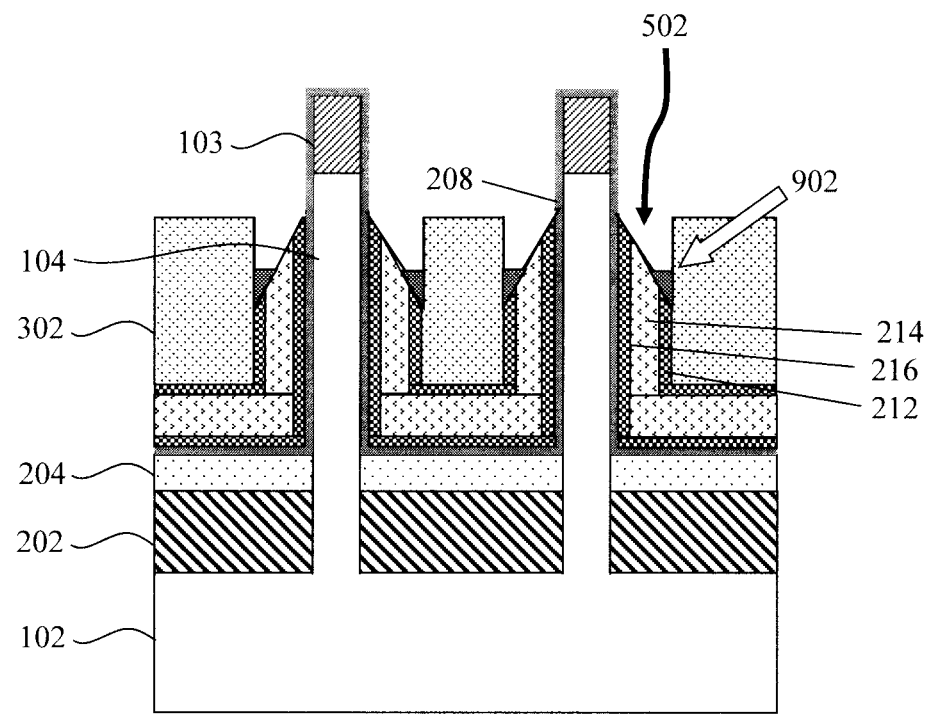
FIG. 9 is a cross-sectional diagram illustrating the liner having been etched back leaving portions of liner (i.e., divots) within the cavities covering the outer layer of work function metal according to an embodiment of the present invention.

Namely, as shown in FIG. 8, a conformal liner 802 is deposited onto the fins 104 and the planarizing dielectric material 302 and lining the cavities 502. Suitable materials for liner 802 include, but are not limited to, nitride liner materials such as silicon nitride (SiN) and/or silicon oxy-carbonitride (SiOCN). Conformal deposition processes such as ALD or CVD can be used to deposit the liner 802. Because certain gate stack components such as high-κ gate dielectrics can be susceptible to damage when exposed to high temperatures, it is preferable to use a low temperature deposition process to deposit the liner 802. Preferably, temperatures are kept below 250° C. during the deposition. A variety of suitable low-temperature methods for depositing nitride materials are known. For example, a suitable low-temperature method for SiN deposition is described in U.S. Patent Application Publication Number 2006/0084283 by Paranjpe et al., entitled "Low Temperature SiN Deposition Methods," the contents of which are incorporated by reference as if fully set forth herein.

Deposition of the liner 802 is performed until gaps within the cavities 502 between the outer layer 212 of the work function metal and the recessed planarizing dielectric material 302 are filled. See FIG. 8. This will enable the liner 802 to selectively remain in the gaps after the rest of the liner 802 has been removed.

Namely, according to an exemplary embodiment, a nitride-selective non-directional (i.e. isotropic) etching process such as a nitride-selective wet chemical etch is next used to etch back the liner 802. See FIG. 9. The timing of the etch needed to clear the liner 802 from the fins 104 and planarizing dielectric material 302 will leave behind the relatively thicker portions 902 of the liner 802 filling the gaps. These remaining patterned portions 902 of liner 802 within the cavities 502, also referred to herein as "divots," will cover and thus serve to protect the outer layer 212 of work function metal during the second etch step used to adjust the sloped profile of the recessed gate stack.

Figure 10:
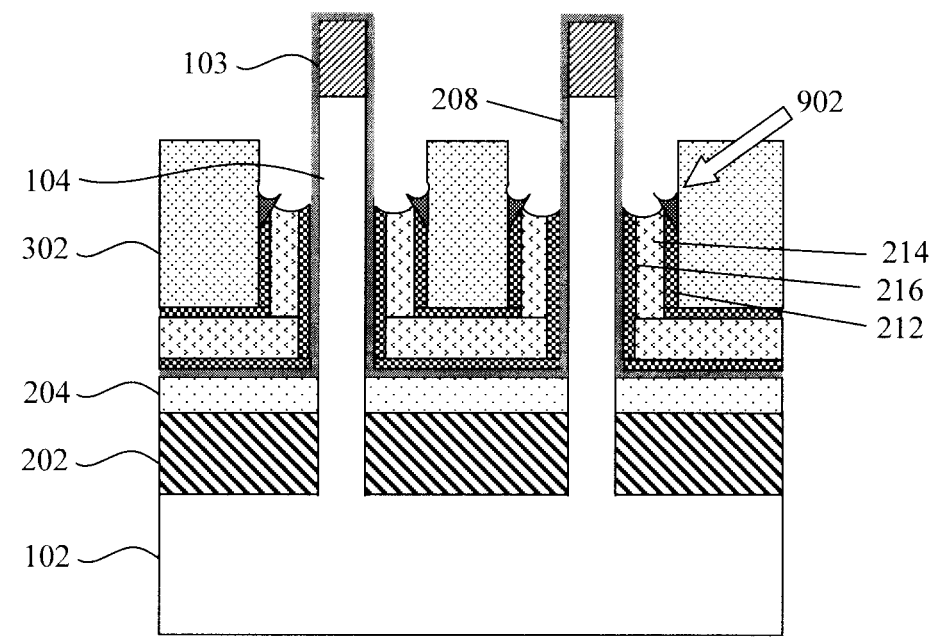
FIG. 10 is a cross-sectional diagram illustrating a second etch having been used to adjust the work function metal variation with no additional work function metal etch occurring where the outer layer is covered by the divots according to an embodiment of the present invention.

Namely, as shown in FIG. 10, a second non-directional (isotropic) etch such as a wet etch like SC1 is used to adjust the work function metal variation. No additional work function metal etch occurs where the outer layer 212 is covered/protected by the portions 902 of liner 802. Thus, this second etch will focus on the inner layers 214 and 216 of the work function metal, effectively eliminating the downward sloping profile within the cavities 502 to a uniform thickness of the gate stacks from the bottom to the top of the fins 104. See FIG. 10. There may be differences in the etch rates of the work function metals employed. For instance, when employed as the inner layers 214 and 216 of work function metals, respectively, the wet etch rate of TiAlC is about 3 times faster than that of TiN. Thus, as shown in FIG. 10, a slight dip is present in the inner layer 214 of work function metal. However, based on the relative thicknesses of these layers (i.e., T2>T3—see FIG. 2, described above), the inner layers 214 and 216 will be etched approximately the same amount. Further, while the portions 902 of liner 802 might be etched slightly during the adjustment, the effect is insignificant.

Figure 11:
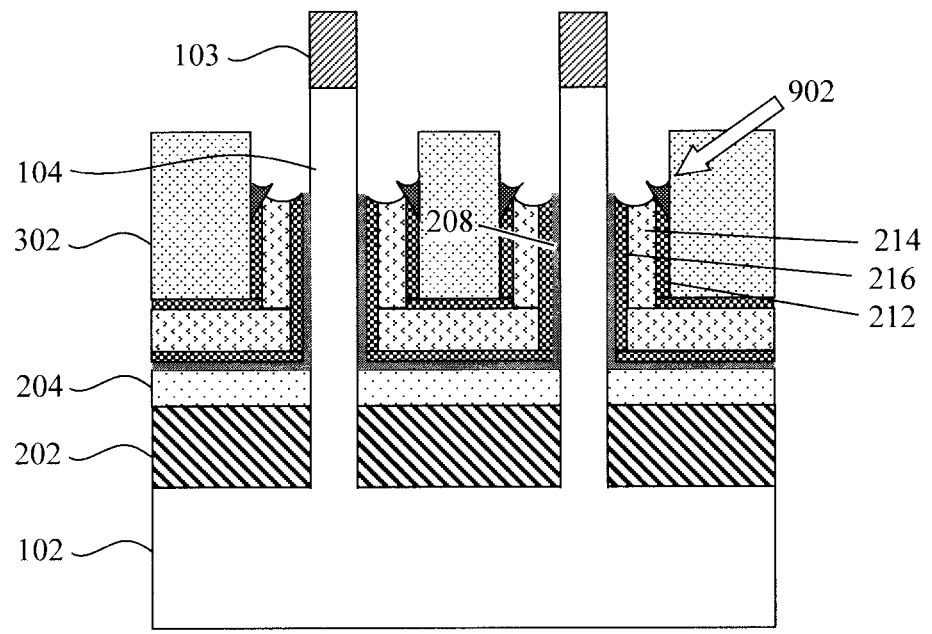
FIG. 11 is a cross-sectional diagram illustrating the gate dielectric having been recessed according to an embodiment of the present invention.

The gate dielectric 208 is then recessed. See FIG. 11. According to an exemplary embodiment, the recess etch of the gate dielectric 208 is performed using an non-directional (isotropic) etching process such as a wet chemical etch. By way of example only, suitable wet chemical etchants for high-K gate dielectrics include, but are not limited to, a diluted hydrofluoric acid+hydrochloric acid (HF+HCl) solution. Optionally, the remaining portions 902 of liner 802 can also be removed. However, as shown in FIG. 11, portions 902 can be left in place and become incorporated with the encapsulation layer to follow.

The planarizing dielectric material 302 is then removed using, e.g., oxygen plasma, nitrogen plasma, hydrogen plasma or other carbon strip process. Removal of the planarizing dielectric material 302 enables the formation of a conformal encapsulation layer 1202 on the gate stacks and exposed tops of the fins 104/fin hardmasks 103. See FIG. 12. Suitable materials for the encapsulation layer 1202 include, but are not limited to, nitride materials such as SiN and/or SiOCN. According to an exemplary embodiment, the encapsulation layer 1202 is deposited using a process such as ALD or CVD to a thickness of from about 3 nm to about 10 nm and ranges therebetween. If left in place, the portions 902 of liner 802 (also formed from a nitride material) become incorporated with the encapsulation layer 1202.

Figure 12:
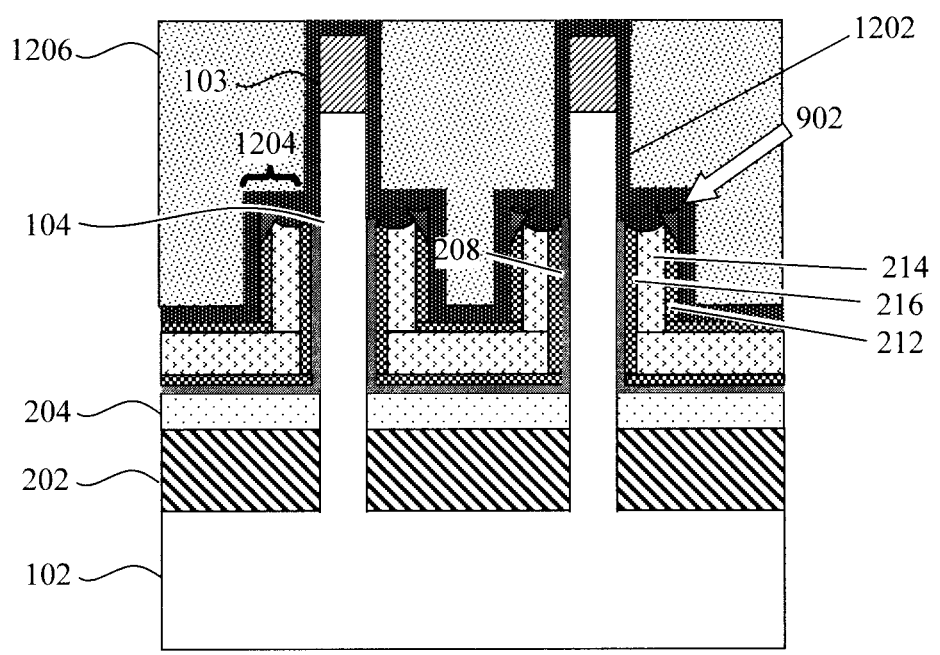
FIG. 12 is a cross-sectional diagram illustrating the planarizing dielectric material having been removed, an encapsulation layer having been formed on the gate stacks and exposed tops of the fins/fin hardmasks which forms top spacers above the gate stacks, and the fins and gate stacks having been buried in an interlayer dielectric according to an embodiment of the present invention.
Figure 13:
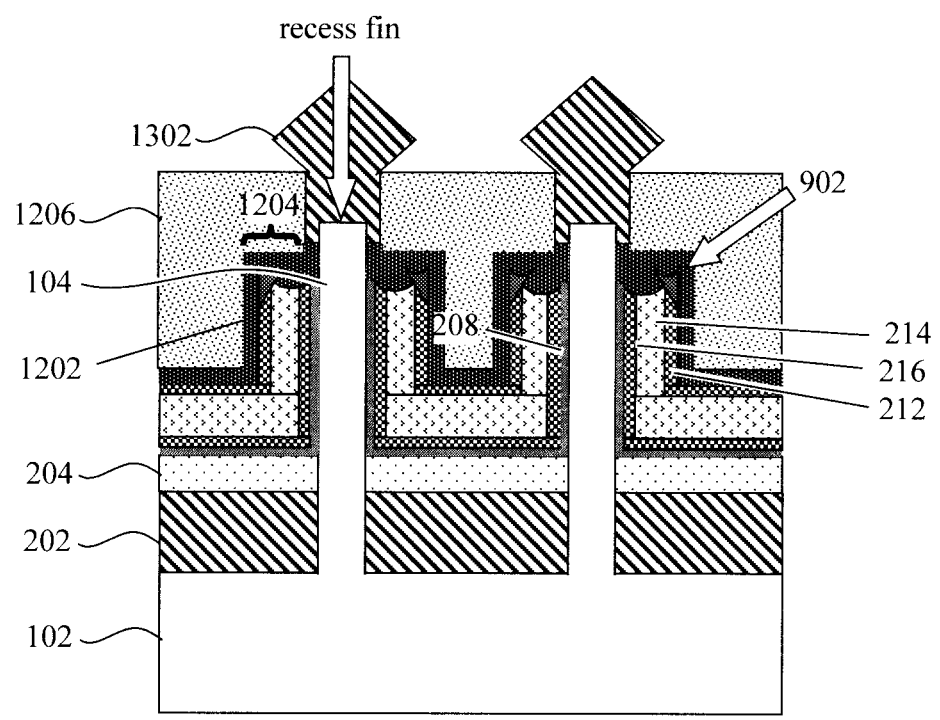
FIG. 13 is a cross-sectional diagram illustrating the encapsulation layer and the fin hardmasks at the tops of the fins having been removed, the fins having been recessed, and top source and drains having been formed at the tops of the fins according to an embodiment of the present invention.

As shown in FIG. 12, portions 1204 of the encapsulation layer 1202 form top spacers above the gate stacks. The bottom spacers and the top spacers offset the gate stack from the bottom and top source and drains, respectively.

The fins 104 and gate stacks are then buried in an interlayer dielectric (ILD) 1206 that is deposited over the encapsulation layer 1202. See FIG. 12. Suitable ILDs include, but are not limited to, oxide dielectric materials such as silicon dioxide ($SiO_2$) and/or silicon oxycarbide (SiOC). The ILD 1206 is then polished using a process such as chemical mechanical polishing (CMP) down to the encapsulation layer 1202 over the fin hardmasks 103.

Polishing the ILD 1206 exposes the encapsulation layer 1202 and the fin hardmasks 103 at the tops of the fins 104, which are then removed. If formed from a nitride material such as SiN, both the encapsulation layer 1202 and the fin hardmasks 103 can be removed using a nitride-selective etch such as a nitride-selective RIE. Now exposed, the tops of the fins 104 can optionally be recessed. See FIG. 13. Recessing the fins 104 brings the top source and drains (formed below) closer to the gate stacks.

Top source and drains 1302 are then formed at the tops of the fins 104. According to an exemplary embodiment, the top source and drains 1302 are formed by growing a doped epitaxial material at the tops of the fins 104. As provided above, suitable source and drain materials include, but are not limited to, Si:P and SiGe:B.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A vertical transport field-effect transistor (VTFET) device, comprising:
   fins patterned in a wafer;
   bottom source/drain regions formed at a base of the fins;
   bottom spacers disposed on the bottom source/drain regions;
   gate stacks alongside the fins, the gate stacks comprising a gate conductor having a combination of work function metals comprising an outer layer and at least one inner layer of the work function metals, wherein the gate stacks have a uniform thickness alongside a portion of the fins;
   triangular shaped cavities present directly over at least the outer layer of the work function metals;
   top spacers disposed above the gate stacks; and
   top source/drain regions at tops of the fins over the top spacers.

2. The VTFET device of claim 1, further comprising:
   a divot within the triangular shaped cavities covering the outer layer of the work function metals, wherein the divot comprises a nitride material.

3. The VTFET device of claim 2, wherein the nitride material is selected from the group consisting of: silicon nitride (SiN), silicon oxycarbonitride (SiOCN), and combinations thereof.

4. The VTFET device of claim 1, wherein the combination of work function metals comprises a first inner layer adjacent to the outer layer, and a second inner layer adjacent to the first inner layer.

5. The VTFET device of claim 4, wherein the outer layer and the second inner layer of the work function metals comprise a same work function metal.

6. The VTFET device of claim 4, wherein the outer layer, the first inner layer and the second inner layer of the work function metals have different thicknesses.

7. The VTFET device of claim 6, wherein the first inner layer is thicker than the second inner layer of the work function metals.

8. The VTFET device of claim 4, wherein the outer layer and the second inner layer of the work function metals both comprise titanium nitride (TiN), and wherein the first inner layer of the work function metals comprises titanium aluminum carbide (TiAlC).

9. The VTFET device of claim 1, wherein the gate stacks further comprise:
   an interfacial oxide on exposed surfaces of the fins;
   a gate dielectric disposed on the fins over the interfacial oxide; and
   the gate conductor disposed on the gate dielectric.

10. The VTFET device of claim 9, wherein the gate dielectric comprises a high-κ gate dielectric.

11. The VTFET device of claim 10, wherein the high-κ gate dielectric is selected from the group consisting of: hafnium oxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium oxide ($ZrO_2$), zirconium silicon oxide ($ZrSiO_4$), zirconium silicon oxynitride ($ZrSiOxNy$), tantalum oxide (TaOx), titanium oxide (TiO), barium strontium titanium oxide ($BaO_6SrTi_2$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$), lead zinc niobite (Pb(Zn,Nb)O), and combinations thereof.

12. The VTFET device of claim 9, wherein the outer layer and the at least one inner layer of the work function metals each comprises a work function metal selected from the group consisting of: titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), titanium carbide (TiC), titanium aluminum carbide (TiAlC), tantalum carbide (TaC), hafnium carbide (HfC), and combinations thereof.

13. The VTFET device of claim 1, wherein the bottom spacers comprise a material selected from the group consisting of: silicon dioxide ($SiO_2$), silicon oxycarbide (SiOC), SiN, silicon-boron-nitride (SiBN), siliconborocarbonitride (SiBCN), SiOCN, and combinations thereof.

14. The VTFET device of claim 1, wherein the top spacers comprise a material selected from the group consisting of: SiN, SiOCN, and combinations thereof.

15. A VTFET device, comprising:
   fins patterned in a wafer;
   bottom source/drain regions formed at a base of the fins;
   bottom spacers disposed on the bottom source/drain regions;
   gate stacks alongside the fins, the gate stacks comprising a gate conductor having a combination of work function metals comprising an outer layer and at least one inner layer of the work function metals, wherein the gate stacks have a uniform thickness alongside a portion of the fins;
   triangular shaped cavities present directly over at least the outer layer of the work function metals;
   a divot within the triangular shaped cavities covering the outer layer of the work function metals, wherein the divot comprises a nitride material selected from the group consisting of: silicon nitride (SiN), silicon oxycarbonitride (SiOCN), and combinations thereof;
   top spacers disposed above the gate stacks; and
   top source/drain regions at tops of the fins over the top spacers.

16. The VTFET device of claim 15, wherein the combination of work function metals comprises a first inner layer adjacent to the outer layer, and a second inner layer adjacent to the first inner layer.

17. The VTFET device of claim 16, wherein the outer layer and the second inner layer of the work function metals comprise a same work function metal.

18. The VTFET device of claim 16, wherein the outer layer, the first inner layer and the second inner layer of the work function metals have different thicknesses.

19. The VTFET device of claim 18, wherein the first inner layer is thicker than the second inner layer of the work function metals.

20. The VTFET device of claim 16, wherein the outer layer and the second inner layer of the work function metals both comprise TiN, and wherein the first inner layer of the work function metals comprises TiAlC.

* * * * *